(12) United States Patent
Nam

(10) Patent No.: US 7,265,042 B2
(45) Date of Patent: Sep. 4, 2007

(54) METHOD FOR FABRICATING SEMICONDUCTOR DEVICE WITH GATE SPACER

(75) Inventor: Ki-Won Nam, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 339 days.

(21) Appl. No.: 11/019,745

(22) Filed: Dec. 20, 2004

(65) Prior Publication Data
US 2006/0094216 A1    May 4, 2006

(30) Foreign Application Priority Data
Oct. 29, 2004    (KR) ...................... 10-2004-0087467

(51) Int. Cl.
*H01L 21/4763* (2006.01)
(52) U.S. Cl. ...................... 438/595; 438/734; 438/738; 257/E21.252
(58) Field of Classification Search ................ 438/595, 438/734, 738; 257/E21.252
See application file for complete search history.

(56) References Cited

U.S. PATENT DOCUMENTS 6,153,483 A * 11/2000 Yeh et al. .................... 438/299
6,225,203 B1 * 5/2001 Liu et al. ..................... 438/595
6,346,725 B1 * 2/2002 Ma et al. ..................... 257/316
6,573,133 B2 * 6/2003 Roy et al. .................... 438/212
6,794,303 B2 * 9/2004 Haselden et al. ........... 438/734
6,977,184 B1 * 12/2005 Chou et al. ..................... 438/9

FOREIGN PATENT DOCUMENTS

KR    2003-0012106 A    2/2003

* cited by examiner

*Primary Examiner*—Trung Dang
(74) *Attorney, Agent, or Firm*—Townsend & Townsend & Crew LLP

(57) ABSTRACT

The present invention relates to a method for fabricating a semiconductor device with gate spacers. The method includes the steps of: forming a plurality of gate structures on a substrate; forming an insulation layer on the gate structures and the substrate; and etching the insulation layer to form gate spacers on sidewalls of the gate structures, wherein the gate spacers have top corners sloped by employing two different etch recipes providing different ranges of a pressure and a gas flow.

20 Claims, 3 Drawing Sheets

METHOD FOR FABRICATING SEMICONDUCTOR DEVICE WITH GATE SPACER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

1. Field of the Invention

The present invention relates to a method for fabricating a semiconductor device; and, more particularly, to a method for forming a semiconductor device with a gate spacer.

2. Description of Related Arts

In general, a dynamic random access memory device (DRAM) is classified into a cell region and a peripheral region. Transistors formed in the peripheral region adopt sources/drains having a lightly doped drain (LDD) structure. Particularly, a gate spacer is employed to form the sources/drains having the LDD structure.

FIGS. 1A and 1B are cross-sectional views for illustrating a method for fabricating a conventional semiconductor device.

Referring to FIG. 1A, a field oxide layer 12 for device isolation is formed in predetermined regions of a substrate 11 divided into a dense (D) region where gate structures are densely disposed and a loose (L) region where gate structures are loosely disposed. Afterwards, a plurality of gate structures 13 are formed on the substrate 11. At this time, although not illustrated, each of the gate structures 13 includes a gate insulation layer, a gate electrode and a gate hard mask.

Next, impurities in low concentration are implanted to form a plurality of LDD junctions 14 in predetermined regions of the substrate 11 corresponding to lateral sides of the individual gate structures 13. Then, a buffer oxide layer 15, a spacer nitride layer 16 and a spacer oxide layer 17 are sequentially formed on the above obtained substrate structure.

Referring to FIG. 1B, a mask 18 for forming a heavily doped P-type or N-type sources/drains is formed on the spacer oxide layer 17. Thereafter, an etching process for forming spacers is carried out to form a plurality of gate spacers 100 on sidewalls of the gate structure 13. At this time, each of the gate spacers 100 includes a patterned buffer oxide layer 15A, a patterned spacer nitride layer 16A and a patterned spacer oxide layer 17A.

The aforementioned etching process for forming the gate spacers 100 is performed under a condition of a low pressure and a small amount of gas flow. Especially, the low pressure ranges from 50 mtorr to 100 mtorr, and the gas flow ranges from 50 sccm to 100 sccm. For instance, the etching process for forming the gate spacers 100 proceeds by employing a fluorine-based gas such as $CF_4$ gas as a main etch gas and oxygen ($O_2$) and argon (Ar) as assisting etch gases. At this time, a total amount of gas flow of $CF_4/O_2/Ar$ is in a range from 50 sccm to 100 sccm, and a chamber pressure is maintained in low pressure ranging from 50 mtorr to 100 mtorr. Through this etching process, each of the gate spacers 100 has rounded edges.

However, as a semiconductor device has been scaled down, sizes of gate structures and spacing distances between the gate structures become inconsistent because materials used for forming spacers have a poor step-coverage characteristic and etch recipes that are not applied uniformly.

As a result of the differentiated sizes and spacing distances between the gate structures, widths of the spacers become different. This difference causes a threshold voltage to vary in a peripheral region, thereby further resulting in degradation of device margins.

The detailed explanation on adverse effects of the differentiated sizes and spacing distances between the gate structures will be provided with reference to the table in below.

TABLE 1

|  | D region | L region |
|---|---|---|
| First line width of a gate structure (F1) | 0.199 | 0.184 |
| Second line width of a resulting structure after depositing a spacer material (F2) | 0.332 | 0.321 |
| Third line width of a resulting structure after etching the spacer material (F3) | 0.328 | 0.318 |
| (F2 − F1)/2 | 0.067 | 0.068 |
| (F3 − F1)/2 | 0.065 | 0.067 |

As shown in Table 1, the first line width F1 of the gate structure is smaller in the L region where the spacing distance between the gate structures is wide than in the D region where the spacing distance between the gate structures is narrow.

In consideration of the difference in the first line widths F1 of the gate structures and on the basis of the second line widths F2 of the gate structures after the deposition of the spacer material, for instance, an oxide layer, the spacer material is more thinly deposited as the spacing distance between the gate structures is narrow. For example, the second line width F2 of the gate structure after the deposition of the spacer material in the D region is 0.332, meaning that the second line width F2 increases by 0.133. On the other hand, the second line width F2 of the gate structure in the L region is 0.321, meaning that the second line width F2 increases by 0.137. Based on this fact, it is verified that the spacer material is deposited more thickly in the L region than in the D region.

Also, after the spacer material is etched, the third line width F3 in the D region is 0.328, while the third line width F3 in the L region is 0.318. These different third line widths F3 indicate that the spacer material is etched more in the D region than in the L region.

On the basis of Table 1, the total thickness of the spacer in the L region is greater than in the D region by 40 Å, corresponding to 40 mV of a threshold voltage of a transistor in a peripheral region. In consideration of a range of the threshold voltage of the transistor in the peripheral region in a 120 nm semiconductor technology, i.e., 150 mV, this value of 40 mV is a very high variation in the threshold voltage.

BRIEF SUMMARY OF THE INVENTION

It is, therefore, an object of the present invention to provide a method for fabricating a semiconductor device capable of forming widths of gate structures with a uniform thickness in a dense region where gate structures are densely formed and in a loose region where gate structures are loosely formed to thereby obtain a stabilized threshold voltage.

In accordance with an aspect of the present invention, there is provided a method for fabricating a semiconductor device, including the steps of: forming a plurality of gate structures on a substrate; forming an insulation layer on the gate structures and the substrate; and etching the insulation layer to form gate spacers on sidewalls of the gate structures, wherein the gate spacers have top corners sloped by employing two different etch recipes providing different ranges of a pressure and a gas flow.

In accordance with another aspect of the present invention, there is provided a method for fabricating a semiconductor device, including the steps of: forming a plurality of gate structures on a substrate; sequentially forming a first oxide layer, a nitride layer and a second oxide layer on the gate structures and the substrate; etching portions of the second oxide layer by applying a first etch recipe; and etching a remaining portion of the second oxide layer and the nitride layer and the first oxide layer until a surface of the substrate is exposed by applying a second etch recipe, thereby obtaining gate spacers with sloped top corners.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device with a gate spacer in accordance with a preferred embodiment of the present invention will be described in detail with reference to the accompanying drawings.

FIGS. 2A to 2D are cross-sectional views for illustrating a method for fabricating a semiconductor device in accordance with the present invention.

Figure 1A:
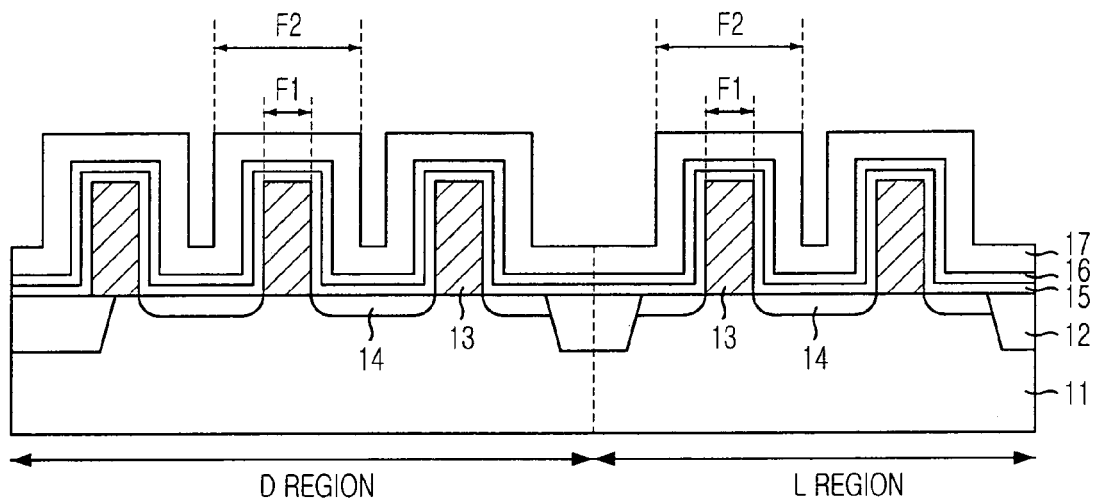
FIGS. 1A to 1B are cross-sectional views illustrating a method for fabricating a conventional semiconductor device.
Figure 1B:
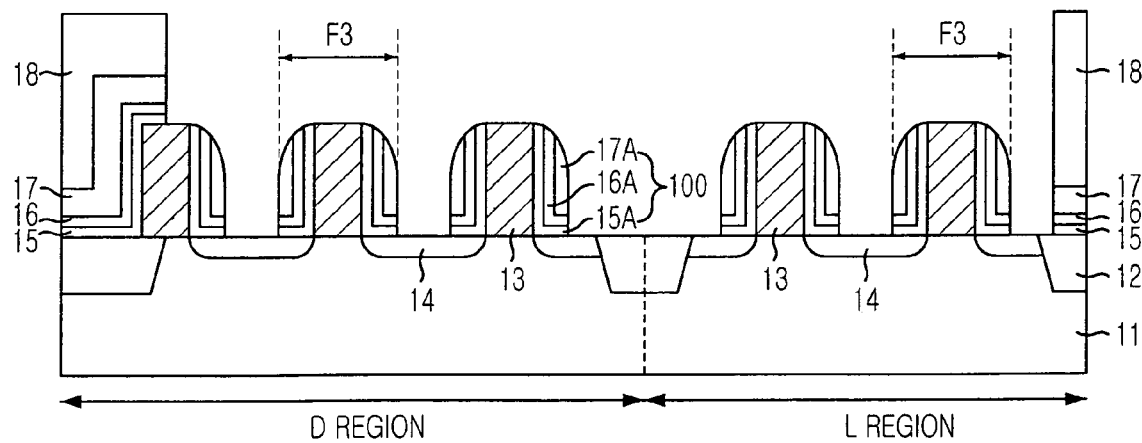
Figure 2A:
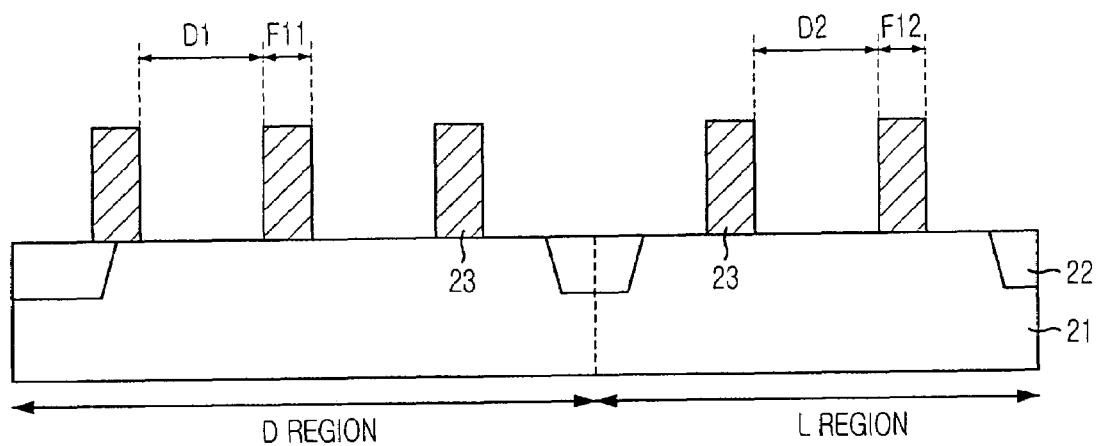
FIGS. 2A to 2D are cross-sectional views illustrating a method for fabricating a semiconductor device in accordance with the present invention.

Referring to FIG. 2A, a field oxide layer 22 for device isolation is formed in predetermined regions of a substrate 21 divided into a dense (D) region where gate structures are densely formed and a loose (L) region where gate structures are loosely formed. Afterwards, a plurality of gate structures 23 are formed on the substrate 21. At this time, although not illustrated, each of the gate structure 23 includes a gate insulation layer, a gate electrode and a gate hard mask. For instance, the gate insulation layer is a silicon oxide ($SiO_2$) layer formed through a thermal oxidation process. The gate electrode is one of a polysilicon layer, a stack layer of polysilicon and tungsten silicide and a stack layer of polysilicon and tungsten. The gate hard mask is made of silicon nitride.

When the gate structures 23 are formed, a first distance D1 between the gate structures 23 in the D region is smaller than a second distance D2 between the gate structures 23 in the L region. Each of the gate structures 23 formed in the D region has a predetermined first line width F11, while each of the gate structures 23 formed in the L region has a predetermined first line width F12.

Figure 2B:
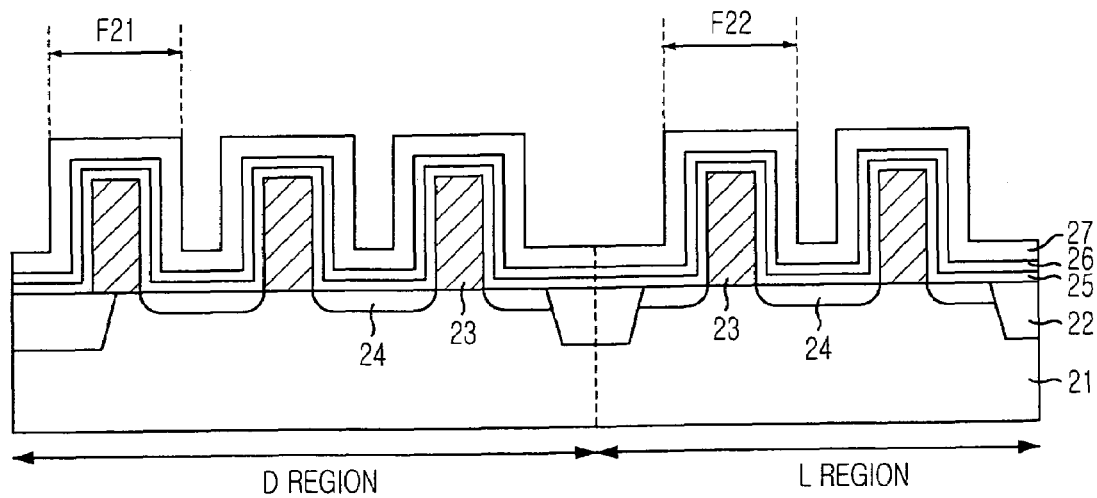

Referring to FIG. 2B, impurities in low concentration are ion implanted to form a plurality of junctions 24 having a lightly doped drain (LDD) structure in the substrate 21. At this time, in case of N-channel metal oxide semiconductor (NMOSFET), the junctions 24 are formed by implanting arsenic (As) or phosphorus (P).

Next, a first oxide layer 25, a nitride layer 26 and a second oxide layer 27 are sequentially formed on the gate structures 23 and the substrate 21. Herein, the first oxide layer 25 serving as a buffer layer is based on a material of plasma enhanced tetraethylorthosilicate (TEOS) and has a thickness ranging from approximately 100 Å to approximately 200 Å. The nitride layer 26 is made of silicon nitride ($Si_3N_4$) and has a thickness ranging from approximately 100 Å to approximately 200 Å. Also, the second oxide layer is made of the same material of TEOS and has a thickness ranging from approximately 500 Å to approximately 700 Å.

After the above first oxide layer 25, the nitride layer 26 and the second oxide layer 27 are deposited on the gate structures 23, the resulting second line width of F21 in the D region is greater than the resulting second line width of F22 in the L region. However, a change in the line width is greater in the D region than in the L region because the second oxide layer 27 is more thickly formed in the L region than in the D region.

Figure 2C:
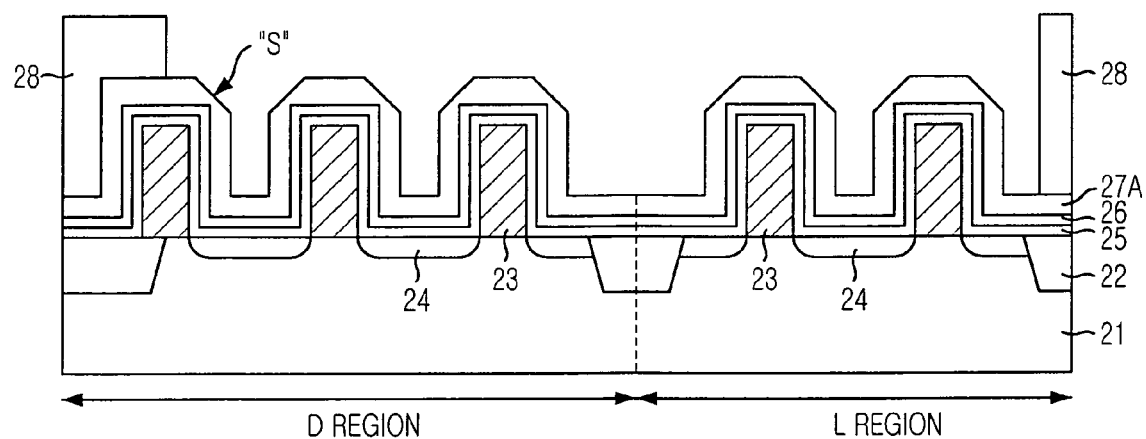

Referring to FIG. 2C, a mask 28 for forming heavily doped P-type or N-type sources/drains is formed. At this time, the mask 28 is formed through a series of processes. First, a photoresist is formed on the second oxide layer 27 and is then patterned through a photo-exposure process and a developing process. Particularly, since the gate structures 23 serve as an ion implantation mask, the mask 28 is formed to cover the field oxide layer 22 but to open the rest regions.

Next, an etching process for forming spacers is performed. However, the etching process proceeds by employing two different etch recipes. At this time, the etching process employs a fluorine-based gas such as $CF_4$ gas as a main etch gas along with assisting etch gases of oxygen (O) and argon (Ar).

More specific to the two different etch recipes, a first etch recipe is employed at an initial stage of the etching process, while a second etch recipe is employed in the main stage of the etching process. In detail, the etching process at the initial stage proceeds under the first recipe of a high pressure ranging from approximately 200 mtorr to approximately 300 mtorr and a large amount of gas flow ranging from approximately 200 sccm to approximately 300 sccm. For instance, a total amount of gas flow of $CF_4/O_2/Ar$ is maintained to be in a range from approximately 200 sccm to approximately 300 sccm, and a chamber pressure is in a range from approximately 200 mtorr to approximately 300 mtorr.

Under the first etch recipe, the etching process is performed until the second oxide layer 27 remains in a thickness ranging from approximately 200 Å to approximately 300 Å. After the initial stage of the etching process, the above spacer materials formed on the gate structures 23 having sloped top corners S. That is, top corners of the second oxide layer 27 disposed on the gate structures 23 are etched to be sloped, thereby giving rise to an etched second oxide layer 27A.

Figure 2D:
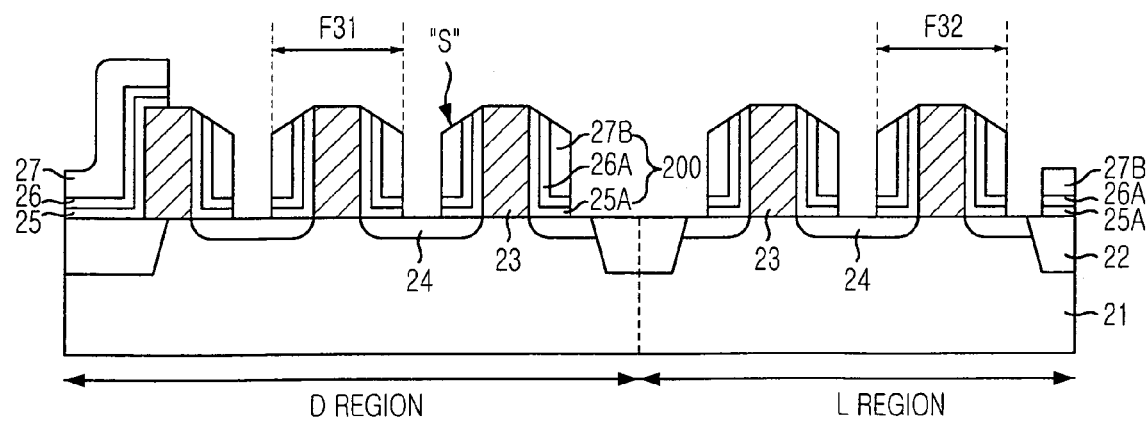

Referring to FIG. 2D, the etching process is continuously performed under the second etch recipe, which is the main etch recipe. That is, the main etching process continues until a surface of the substrate 21 is exposed.

By the main etching process, the nitride layer 26 and the first oxide layer 25 are etched until the surface of the substrate 21 is exposed, whereby a plurality of gate spacers 200 are formed on sidewalls of the gate structures 23. At this time, each of the gate spacers 200 includes a patterned second oxide layer 27B, a patterned nitride layer 26A and a patterned first oxide layer 25A.

The main etching process is carried out under a low pressure ranging from approximately 50 mtorr to approximately 100 mtorr and a small amount of gas flow ranging from approximately 50 sccm to approximately 100 sccm. For instance, a total amount of the etch gas flow of $CF_4/O_2/Ar$ is maintained to be in a range from approximately 50 sccm to approximately 100 sccm. A chamber pressure ranges from approximately 50 mtorr to approximately 100 mtorr.

The reason for maintaining the pressure and the gas flow low in the main etching process is to increase etch selectivity of the first oxide layer 25 with respect to silicon constituting the substrate 21, thereby preventing the substrate 21 from being excessively etched.

As described above, the etching process is performed under two different recipes in combination to thereby obtain the sloped top corners S of the gate spacers 200. As a result of the sloped top corners S of the gate spacers 200, an overall profile of the gate spacers 200 is more vertical, thereby applying the etching process uniformly throughout and thus, obtaining uniform line widths of the gate spacers 200.

Hereinafter, changes in line widths of the gate spacers 200 according to the first etch recipe and the second etch recipe will be described with reference to Table 2 provided below.

TABLE 2

|  | First application of etching process | | Second application of etching process | |
| --- | --- | --- | --- | --- |
|  | D region | L region | D region | L region |
| First line width of a gate structure | 0.199 (F11) | 0.184 (F12) | 0.199 (F11) | 0.184 (F12) |
| Second line width of a resulting structure after depositing spacer materials | 0.333 (F21) | 0.323 (F22) | 0.333 (F21) | 0.322 (F22) |
| Third line width of a resulting structure after etching the spacer materials | 0.354 (F31) | 0.378 (F32) | 0.326 (F31) | 0.309 (F32) |
| (The second line width − the first line width)/2 | 0.067 | 0.069 | 0.067 | 0.069 |
| (The third line width − the first line width)/2 | 0.078 | 0.097 | 0.064 | 0.062 |

Herein, the etching process is carried out under the above described first etch recipe and the second etch recipe in combination. Also, the same spacer materials described in FIGS. 2A to 2D are used.

As shown in Table 2, when the first etch recipe that makes top corners of the spacer materials sloped is performed, it is possible to minimize the change in the line width.

Hereinafter, changes in the first to the third line widths obtained in case of the second application of the etching process will be investigated.

For the second line widths after the second oxide layer is formed, the second line width F21 in the D region is approximately 0.333 and thus, increases by approximately 0.134 from the first line width F12 of the gate structure in the D region. Also, in the L region, the second line width F22 is approximately 0.322 and thus, increases by approximately 0.138 from the first line width F12 of the gate structure in the L region. As a result, it is verified that the second oxide layer is more thinly deposited in the D region than in the L region.

After the etching process is performed to the spacer materials, the third line width F31 in the D region is approximately 0.326 and thus, decreases by approximately 0.007 from the second line width F21. Meanwhile, in the L region, the third line width F32 is approximately 0.309 and thus, decreases by approximately 0.013 from the second line width F22. On the basis of the decrease in the line width, it is verified that the spacer materials are etched two times more in the L region than in the D region.

As for the final width of each gate spacer obtained by subtracting the first line width from the third line width, the final width of the gate spacer in the D region is approximately 0.064, while the final width of the gate spacer in the L region is approximately 0.062. Thus, it can be concluded that the line widths of the gate spacers are minimal because of the sloped top corners of the gate spacers in the beginning of the etching process.

It is noted that the change in the line widths of the gate spacers in the D region and in the L region slightly increases.

On the basis of the present invention, it is possible to increase or decrease the line widths of the gate spacers depending on the etch recipes for forming the gate spacers. Simultaneously, a difference between the line width of the gate spacer in the D region and that in the L region can also be controllable. These effects can be achieved by making top corners of the lastly deposited gate spacer material, i.e., the second oxide layer, sloped instead of being rounded through applying the etch recipe of a high pressure and a large amount of gas flow at the initial stage of the etching process for forming the gate spacers. As a result of these effects, it is further possible to obtain a stabilized threshold voltage in the peripheral region.

The present application contains subject matter related to the Korean patent application No. KR 2004-87467, filed in the Korean Patent Office on Oct. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a plurality of gate structures over a semiconductor substrate;
   forming a first insulation layer over the gate structures and the substrate;
   forming a second insulation layer over the first insulation layer;
   forming a third insulation layer over the second insulation layer;
   etching a portion of the third insulation layer using a first etch process without exposing the second insulation layer provided below the third insulation layer, the first etch process using a first pressure level and a first gas flow amount; and
   etching the first, second, and third insulation layers using a second etch process until the semiconductor substrate is exposed and the first, second, third insulation layers define a plurality of gate spacers, the second etch process using a second pressure level and a second gas flow amount, wherein the second pressure level is no more than 100 mtorr to increase an etch selectivity of the first insulation layer with respect to the semiconductor substrate, so that the etching of the semiconductor substrate is minimized.

2. A method for fabricating a semiconductor device, comprising the steps of:

forming a plurality of gate structures on a substrate;

forming an insulation layer on the gate structures and the substrate; and etching the insulation layer to form gate spacers on sidewalls of the gate structures wherein the gate spacers have top corners sloped by employing two different etch recipes providing different ranges of a pressure and a gas flow, wherein the two different etch recipes provide a fluorine-based etch gas as a main etch gas and oxygen ($O_2$) and argon (Ar) as secondary etch gases.

3. The method of claim 2, wherein the step of forming the gate spacers includes:

etching portions of the insulation layer by applying a first etch process that makes top corners of the gate spacers sloped; and performing a main etching process to the resulting insulation layer until a surface of the substrate is exposed by applying a second etch process.

4. The method of claim 3, wherein the first etch process provides a pressure and a total amount of gas flow greater than those provided by the second etch process.

5. The method of claim 3, wherein the first etch process provides a pressure ranging from approximately 200 mtorr to approximately 300 mtorr and a total amount of gas flow ranging from approximately 200 sccm to approximately 300 sccm.

6. The method of claim 3, wherein the second etch process provides a pressure ranging from approximately 50 mtorr to approximately 100 mtorr and a total amount of gas flow ranging from approximately 50 sccm to approximately 100 sccm.

7. A method for fabricating a semiconductor device, the method comprising:

forming a plurality of gate structures on a substrate;

sequentially forming a first oxide layer, a nitride layer and a second oxide layer on the gate structures and the substrate;

etching a portion of the second oxide layer by using a first etch process; and etching a remaining portion of the second oxide layer and the nitride layer and the first oxide layer until a surface of the substrate is exposed by using a second etch process, thereby obtaining gate spacers with sloped top corners, wherein the first and second etch process use the same etch gases but different chamber pressures and gas flow amounts.

8. The method of claim 7, wherein the first etch process and the second etch process both use a fluorine-based gas as a main etch gas and $O_2$ and Ar as secondary etch gases.

9. The method of claim 7, wherein the first etch process uses a higher chamber pressure and greater gas flow amount than those used by the second etch process.

10. The method of claim 7, wherein the first etch process uses a pressure ranging from approximately 200 mtorr to approximately 300 mtorr and a total amount of gas flow ranging from approximately 200 sccm to approximately 300 sccm, wherein the etch gases used include a fluorine-based gas as a main etch gas and $O_2$ and Ar as secondary etch gases.

11. The method of claim 10 wherein the second etch process uses a pressure ranging from approximately 50 mtorr to approximately 100 mtorr and a total amount of gas flow ranging from approximately 50 sccm to approximately 100 sccm, wherein the etch gases used include a fluorine-based gas as a main etch gas and $O_2$ and Ar as secondary etch gases.

12. The method of claim 7, wherein the first oxide layer is a buffer oxide layer having a thickness ranging from approximately 100 Å to approximately 200 Å.

13. The method of claim 7, wherein the nitride layer has a thickness ranging from approximately 100 Å to approximately 200 Å.

14. The method of claim 7, wherein the second oxide layer has a thickness ranging from approximately 500 Å to approximately 700 Å.

15. The method of claim 7, wherein in the step of etching the portion of the second oxide layer by applying the first etch process, the second oxide layer is etched until a thickness of the remaining second oxide layer ranges from approximately 200 Å to approximately 300 Å.

16. The method of claim 1, wherein the first pressure level is between 200-300 mtorr and the first gas flow amount is between 200-300 sccm, wherein the second pressure level is between 50-100 mtorr and the second gas flow amount is between 50-100 sccm, wherein, the first and second gas flow amounts being combined gas flow amounts of etch gases used for the first and second etch processes, respectively.

17. The method of claim 16, wherein the first insulation layer includes oxide and the semiconductor substrate includes silicon.

18. The method of claim 16, wherein etch gases used in the first etch process includes a fluorine-based gas, an oxygen-based gas($O_2$) and an argon-based gas.

19. The method of claim 18, wherein the fluorine-based gas is $CF_4$, the oxygen-based gas is oxygen, and the argon-based gas is argon.

20. The method of claim 18, wherein the etch gases used in the first etch process are used in the second etch process.

* * * * *